(12) United States Patent
Aruga

(10) Patent No.: US 6,603,700 B2
(45) Date of Patent: Aug. 5, 2003

(54) NON-VOLATILE SEMICONDUCTOR MEMORY DEVICE HAVING REDUCED POWER REQUIREMENTS

(75) Inventor: Rie Aruga, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 41 days.

(21) Appl. No.: 09/978,594

(22) Filed: Oct. 18, 2001

(65) Prior Publication Data

US 2002/0054531 A1 May 9, 2002

(30) Foreign Application Priority Data

Oct. 23, 2000 (JP) .......................... 2000-322311

(51) Int. Cl.[7] .................. G11C 7/00; G11C 16/04; G11C 8/00
(52) U.S. Cl. .............. 365/226; 365/230.03; 365/185.11
(58) Field of Search ........................ 365/185.11, 226, 365/229, 189.04, 230.03, 189.01, 218

(56) References Cited

U.S. PATENT DOCUMENTS

| 4,878,203 | A | | 10/1989 | Arakawa | |
|---|---|---|---|---|---|
| 5,282,174 | A | * | 1/1994 | Little | 365/189.04 |
| 6,314,028 | B1 | * | 11/2001 | Kono | 365/189.09 |
| 6,377,502 | B1 | * | 4/2002 | Honda et al. | 365/185.11 |

FOREIGN PATENT DOCUMENTS

JP          8-18018          1/1996

* cited by examiner

*Primary Examiner*—Thong Le
(74) *Attorney, Agent, or Firm*—McDermott, Wil & Emery (57) ABSTRACT

A non-volatile semiconductor memory device includes a first memory bank, a second memory bank, a first power supply circuit, and a second power supply circuit. In write operation, the first power supply circuit supplies a boosted voltage to the first memory bank, and the second power supply circuit supplies a boosted voltage to the second memory bank. This enables sufficient current supply capability to be assured. On the other hand, in read operation, only the second power supply circuit supplies a boosted voltage to the first and second memory banks. This enables reduction in power consumption.

10 Claims, 5 Drawing Sheets

| MODE | VSEL1 | VSEL2 | SSEL1 | SSEL2 |
|---|---|---|---|---|
| READ | L | H | L | H |
| WRITE | H | H | H | L |
| ERASE | H | H | H | L |

NON-VOLATILE SEMICONDUCTOR MEMORY DEVICE HAVING REDUCED POWER REQUIREMENTS

BACKGROUND OF THE INVENTION

The present invention generally relates to a non-volatile semiconductor memory device. More particularly, the present invention relates to a rewritable non-volatile semiconductor memory device having a plurality of memory banks.

The rewritable non-volatile semiconductor memories can be roughly divided into FN (Fowler-Nordheim) erase/CHE (Channel Hot Electron) write type EEPROMs (Electrically Erasable Programmable Read Only Memories) and FN erase/FN write type EEPROMs. Since the FN erase/FN write type EEPROM consumes a very small amount of current in write operation, a large number of bits can be written at a time. This reduces the write time per bit, which is effective in a memory having larger capacitance. For example, even if the write time per bit is 1 ms, simultaneously writing 1,024 bits would result in 0.97 $\mu$s per bit, and simultaneously writing 8,192 bits would result in 0.12 $\mu$s per bit, enabling a higher write operation speed than in the case where 32 bits are simultaneously written with 10 $\mu$s in the CHE mode (0.31 $\mu$s per bit).

In order to write the data to a multiplicity of memory cells simultaneously, it is desirable that the memory cells to be written are connected to a common word line. However, a memory array must be divided in view of storage of the write data and fast reading of the memory array.

Moreover, such an FN erase/FN write type semiconductor memory requires a high voltage (e.g., 9 V) and thus requires a power supply circuit for boosting a low power supply voltage (e.g., 2.5 V). For example, in the FN erase/FN write type memory, a voltage of –9.0 V is applied to a substrate and source lines in a memory array to be erased at a time, a voltage of +8.0 V is applied to word lines therein, and drains therein are rendered in a floating state. Every memory cell in the memory array to be erased at a time is rendered to have an increased threshold value. In write operation, a voltage of 0 V is applied to the substrate and the source line of a memory cell to be written, and a voltage of –9.0 V is applied to a word line (control gate) thereof. Moreover, a voltage of 6.0 V is applied to the drain of the memory cell to be written, and a voltage of 0.0 V is applied to the drain of a memory cell that is not to be written. The memory cell thus written has a reduced threshold value, and the threshold value of the non-written memory cell remains high.

In such write operation, setting the drain voltage of the memory cell to be written to a high voltage according to the write data and setting the drain voltage of the memory cell that is not to be written to a low voltage enables writing to all the memory cells on the same word line. Moreover, even if the memory array is divided into a plurality of banks, providing each bank with a write circuit would enable simultaneous writing to a multiplicity of memory cells included in the plurality of banks.

However, in order to write to a multiplicity of memory cells simultaneously, the power supply circuit for supplying a high voltage required for writing/erasing must have increased current supply capability. On the other hand, even in the situation where rewriting is not conducted, there is a case where a boosted power supply voltage is supplied also in read operation, for example, in order to increase the read speed even in low-voltage operation. In such a case, supplying a voltage from the power supply circuit with its current supply capability increased in order to write to a multiplicity of memory cells simultaneously would result in increased power consumption.

SUMMARY OF THE INVENTION

It is an object of the present invention to provide a non-volatile semiconductor memory device capable of reducing power consumption.

According to one aspect of the present invention, a non-volatile semiconductor memory device includes a first memory bank, a second memory bank, a first power supply circuit and a second power supply circuit. The first power supply circuit supplies to the first memory bank a boosted voltage for writing to a memory cell in the first memory bank in write operation. The second power supply circuit supplies to the second memory bank a boosted voltage for writing to a memory cell in the second memory bank in write operation, and supplies to the first and second memory banks a boosted voltage for reading from a memory cell in the first and second memory banks in read operation.

In the above non-volatile semiconductor memory device, in write operation, the first power supply circuit supplies the boosted voltage for writing to the first memory bank, and the second power supply circuit supplies the boosted voltage for writing to the second memory bank, enabling sufficient current supply capability to be assured. On the other hand, in read operation, only the second power supply circuit supplies the boosted voltage for reading to the first and second memory banks, enabling reduction in power consumption.

According to another aspect of the present invention, a non-volatile semiconductor memory device for simultaneously writing to a plurality of memory banks in write operation, and selectively reading from at least one of the plurality of memory banks in read operation includes a first memory bank, a second memory bank, a first power supply circuit, a second power supply circuit and a supply control circuit. The first power supply circuit outputs a boosted voltage for writing to a memory cell in the first memory bank in write operation. The second power supply circuit outputs a boosted voltage for writing to a memory cell in the second memory bank in write operation, and outputs a boosted voltage for reading from a memory cell in the first and second memory banks in read operation. The supply control circuit supplies the boosted voltage for writing from the first power supply circuit to the first memory bank as well as supplies the boosted voltage for writing from the second power supply circuit to the second memory bank in write operation, and supplies the boosted voltage for reading from the second power supply circuit to the first and second memory banks in read operation.

In the above non-volatile semiconductor memory device, in write operation, the boosted voltage for writing from the first power supply circuit is supplied to the first memory bank, and the boosted voltage for writing from the second power supply circuit is supplied to the second memory bank, enabling sufficient current supply capability to be assured. In read operation, the boosted voltage for reading from the second power supply circuit is supplied to the first and second memory banks, in other words, the first power supply circuit does not supply any boosted voltage to the memory banks in read operation, enabling reduction in power consumption.

Preferably, the supply control circuit includes a first switch, a second switch and a third switch. The first switch is connected between the first memory bank and the first power supply circuit. The second switch is connected between the second memory bank and the second power supply circuit. The third switch is connected between the first memory bank and the second power supply circuit.

In the above non-volatile semiconductor memory device, in write operation, the first switch and the second switch are turned ON, and the third switch is turned OFF. Accordingly, the boosted voltage for writing from the first power supply circuit is supplied to the first memory bank through the first switch while the boosted voltage for writing from the second power supply circuit is supplied to the second memory bank through the second switch. On the other hand, in read operation, the first switch is turned OFF, and the second switch and the third switch are turned ON. Accordingly, the boosted voltage for reading from the second power supply circuit is supplied to the first memory bank and the second memory bank through the third switch and the second switch, respectively.

Preferably, the first power supply circuit is stopped in read operation. This reduces power consumption in read operation.

Preferably, the first power supply circuit renders its output in a high impedance state in read operation.

In the above non-volatile semiconductor memory device, in read operation, the first power supply circuit is electrically disconnected from the memory banks, so that only the second power supply circuit is connected to the first and second memory banks.

Preferably, an ON resistance value of the second switch is equal to that of the third switch.

In the above non-volatile semiconductor memory device, in read operation, power supply impedance seen by the first memory bank is equal to that seen by the second memory bank. This enables the power to be stably supplied with high accuracy to the first and second memory banks on the same conditions.

Preferably, the first and second memory banks include FN erase/FN write type electrically rewritable non-volatile memory cells.

The FN erase/FN write type non-volatile memory cells enable simultaneous writing to a multiplicity of memory cells. Accordingly, the non-volatile semiconductor memory device is capable of simultaneously writing to a multiplicity of memory cells in the first and second memory banks in write operation.

Preferably, each of the first power supply circuit and the second power supply circuit includes a booster circuit having a charge pump.

In the above non-volatile semiconductor memory device, in write operation, a high voltage resulting from boosting by the charge pump enables simultaneous writing to the first and second memory banks. In read operation, charge pumping operation of the first power supply circuit is not required, resulting in reduction in power consumption.

Preferably, the non-volatile semiconductor memory device further includes a capacitor connected to an output node of the first power supply circuit.

The above non-volatile semiconductor memory device enables load capacitance of the first power supply circuit to be equal to that of the second power supply circuit, allowing accurate, stable power supply.

DESCRIPTION OF THE PREFERRED EMBODIMENTS

A non-volatile semiconductor memory device according to the present invention includes two or more memory banks, and boosters for the respective memory banks. The boosters have a size required for read operation.

In write and erase operations, every booster is operated so that data is written to and erased from as many memory cells as possible at a time, whereby the write and erase time is reduced. In read operation requiring consideration of power consumption, however, only at least one of the two or more boosters is operated, and the remainder is stopped. Power is supplied to every memory bank from the operating booster (or boosters) in order to reduce power consumption.

In read operation, only one memory bank is accessed at a time. Therefore, power consumption may also be reduced by operating only a booster corresponding to the memory bank to be accessed. According to this method, however, if the memory bank to be accessed is changed, setup time on the order of microseconds is required to cause a corresponding booster that is not operating to resume boosting operation. Therefore, this method is not practical for high-speed read operation.

Figure 1:
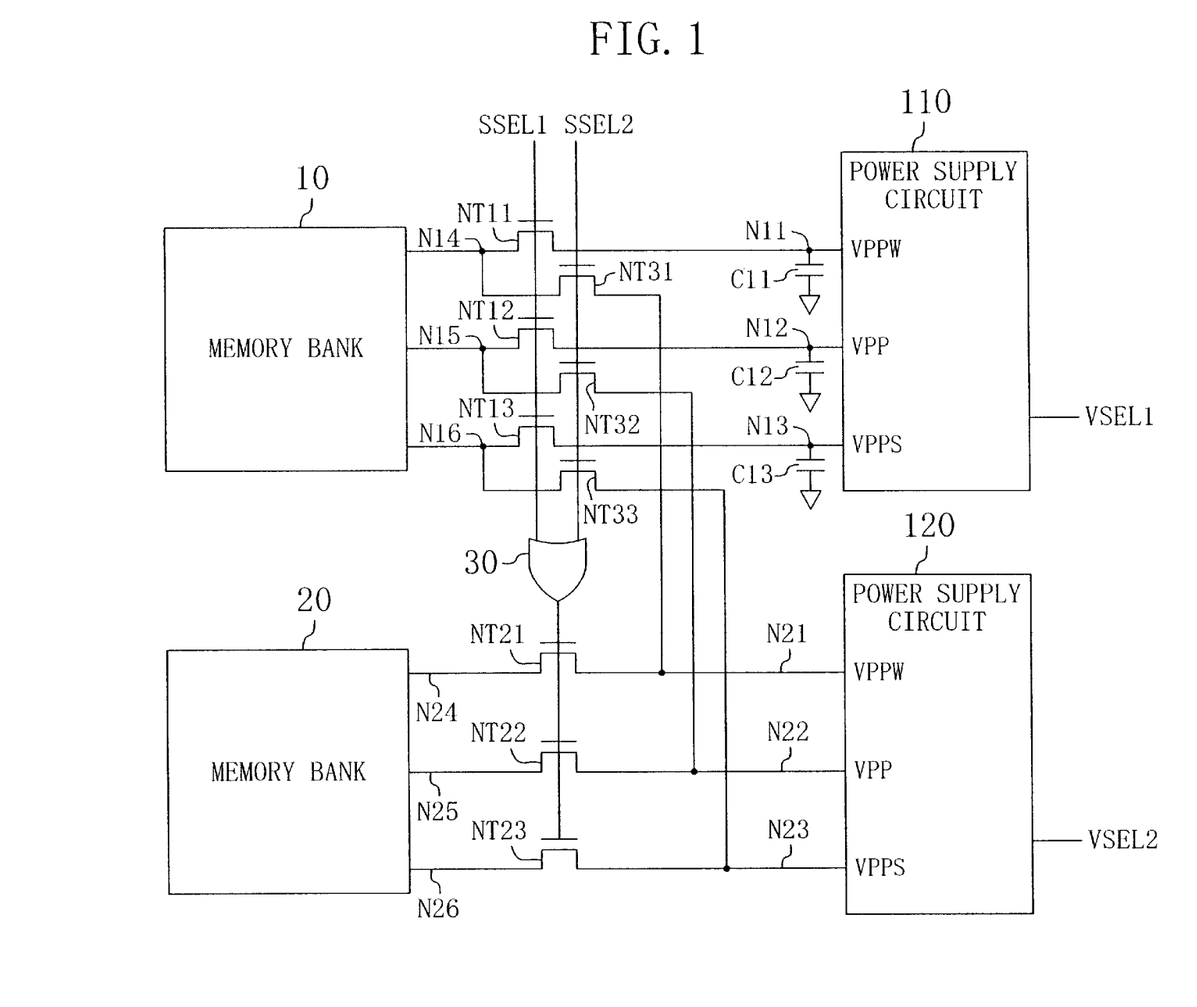
FIG. 1 is a block diagram showing the structure of a non-volatile semiconductor memory device according to an embodiment of the present invention.

FIG. 1 is a block diagram showing the structure of the non-volatile semiconductor memory device according to an embodiment of the present invention. The non-volatile semiconductor memory device of FIG. 1 includes memory banks 10 (first memory bank) and 20 (second memory bank), power supply circuits 110 (first power supply circuit) and 120 (second power supply circuit), N-channel MOS (Metal Oxide Semiconductor) transistors NT11 to NT13 (first switches), NT21 to NT23 (second switches) and NT31 to NT33 (third switches), an OR circuit 30, and capacitors C11 to C13.

The power supply circuit 110 is activated in response to a control signal VSEL1, and outputs boosted voltages VPPW, VPP, VPPS, that is, boosted power supply voltage, to output nodes N11 to N13, respectively. The power supply circuit 120 is activated in response to a control signal VSEL2, and outputs boosted voltages VPPW, VPP, VPPS, that is, boosted power supply voltage, to output nodes N21 to N23, respectively.

The N-channel MOS transistors NT11 to NT13 are connected between the output nodes N11 to N13 of the power supply circuit 110 and input nodes N14 to N16 of the memory bank 10, respectively, and turned ON/OFF in response to a control signal SSEL1.

The N-channel MOS transistors NT31 to NT33 are connected between the output nodes N21 to N23 of the power supply circuit 120 and the input nodes N14 to N16 of the memory bank 10, respectively, and turned ON/OFF in response to a control signal SSEL2.

The OR circuit 30 outputs the OR operation result of the control signals SSEL1 and SSEL2.

The N-channel MOS transistors NT21 to NT23 are connected between the output nodes N21 to N23 of the power supply circuit 120 and input nodes N24 to N26 of the memory bank 20, respectively, and turned ON/OFF in response to the output of the OR circuit 30.

The capacitors C11 to C13 are connected between the output nodes N11 to N13 of the power supply circuit 110 and the ground node, respectively.

Figure 2:
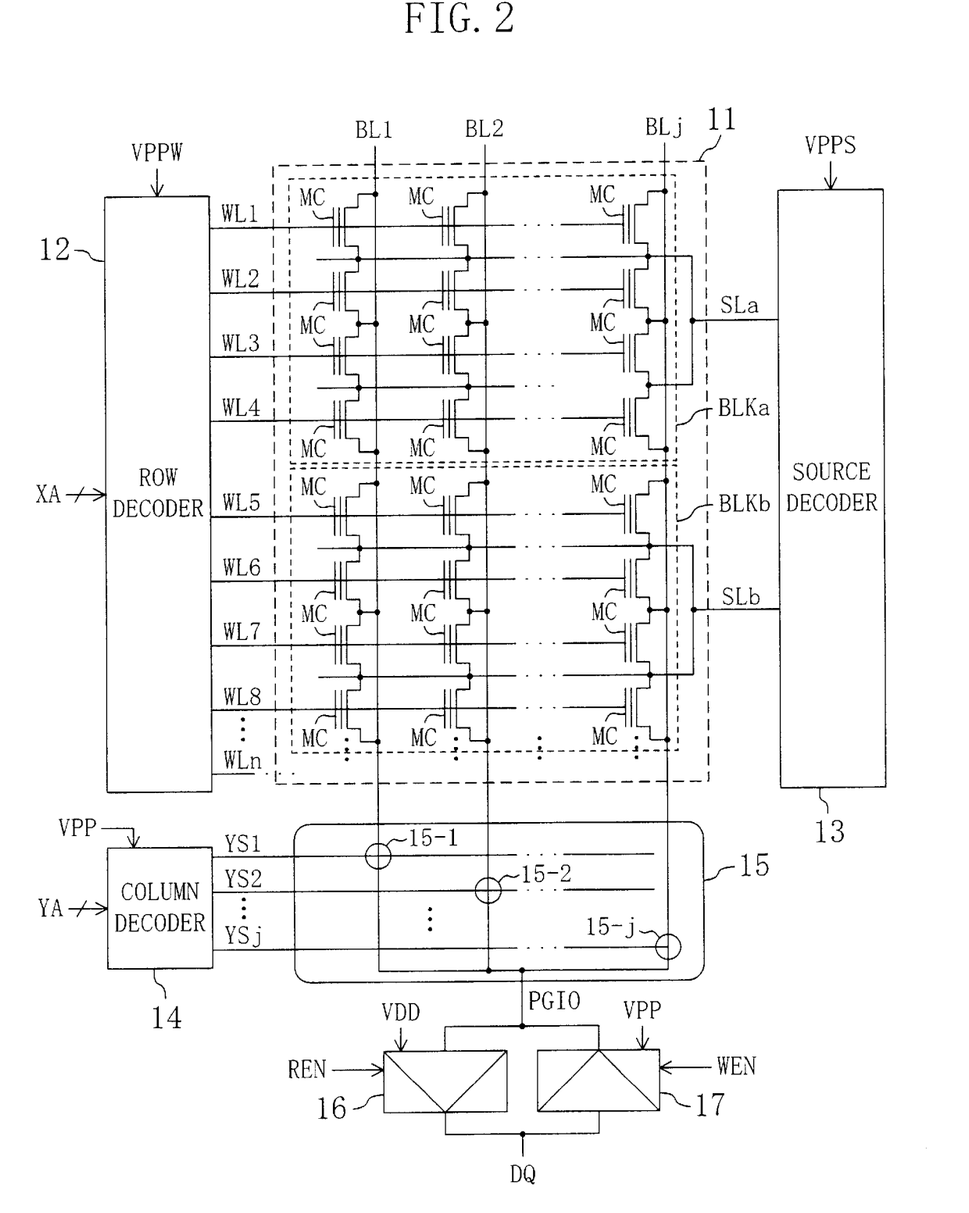
FIG. 2 is a block diagram showing the internal structure of a memory bank in FIG. 1.

FIG. 2 is a diagram showing the internal structure of the memory bank 10 in FIG. 1. As shown in FIG. 2, the memory bank 10 includes a memory array 11, word lines WL1 to WLn, bit lines BL1 to BLj, source lines SLa, SLb, . . . , a row decoder 12, a source decoder 13, a column decoder 14, a column selection circuit 15, a read circuit 16, and a write circuit 17.

The memory array 11 includes a plurality of memory cells MC arranged in a matrix (n rows by j columns). The plurality of memory cells MC are FN erase/FN write-type EEPROM cells.

The word lines WL1 to WLn are arranged in rows. Each word line is connected to the control gates of j memory cells MC arranged in a corresponding row.

The bit lines BL1 to BLj are arranged in columns. Each bit line is connected to the drains of n memory cells MC arranged in a corresponding column.

The memory array 11 is divided into a plurality of blocks BLKa, BLKb, in the row direction. Each block includes 4×j (four rows by j columns) memory cells MC. The source lines SLa, SLb, . . . are arranged corresponding to the plurality of blocks BLKa, BLKb, . . . , respectively. Each source line is connected to the sources of 4×j (four rows by j columns) memory cells MC arranged in a corresponding block.

In write operation, the row decoder 12 supplies a negative voltage −V to a word line corresponding to a row address signal XA. In erase operation, the row decoder 12 supplies to the word line corresponding to the row address signal XA a boosted voltage VPPW supplied from the power supply circuit 110 to the input node N14. In read operation, the row decoder 12 supplies to the word line corresponding to the row address signal XA a boosted voltage VPPW supplied from the power supply circuit 120 to the input node N14.

In write operation, the source decoder 13 supplies to a source line corresponding to a block including a memory cell MC to be written a boosted voltage VPPS supplied from the power supply circuit 110 to the input node N16. In erase operation, the source decoder 13 supplies a negative voltage −V to a source line corresponding to a block to be erased. In read operation, the source decoder 13 supplies a ground voltage to a source line corresponding to a block including the memory cell MC to be read.

The column decoder 14 activates a column selection signal YS1 to YSj corresponding to a column address signal YA.

The column selection circuit 15 includes column selection gates 15-1 to 15-j. The column selection gates 15-1 to 15-j each connects/disconnects a corresponding bit line BL1 to BLj to/from an input/output (I/O) line PGIO in response to a corresponding column selection signal YS1 to YSj.

In read operation, the read circuit 16 is activated in response to an enable signal REN, and externally outputs the data read from a memory cell MC to the I/O line PGIO as read data DQ.

In write operation, the write circuit 17 is activated in response to an enable signal WEN, and supplies a boosted voltage VPP supplied from the power supply circuit 110 to the input node N15 to the I/O line PGIO according to external write data DQ.

Note that the memory bank 20 shown in FIG. 1 has the same internal structure as that of the memory bank 10 shown in FIG. 2.

Figure 3:
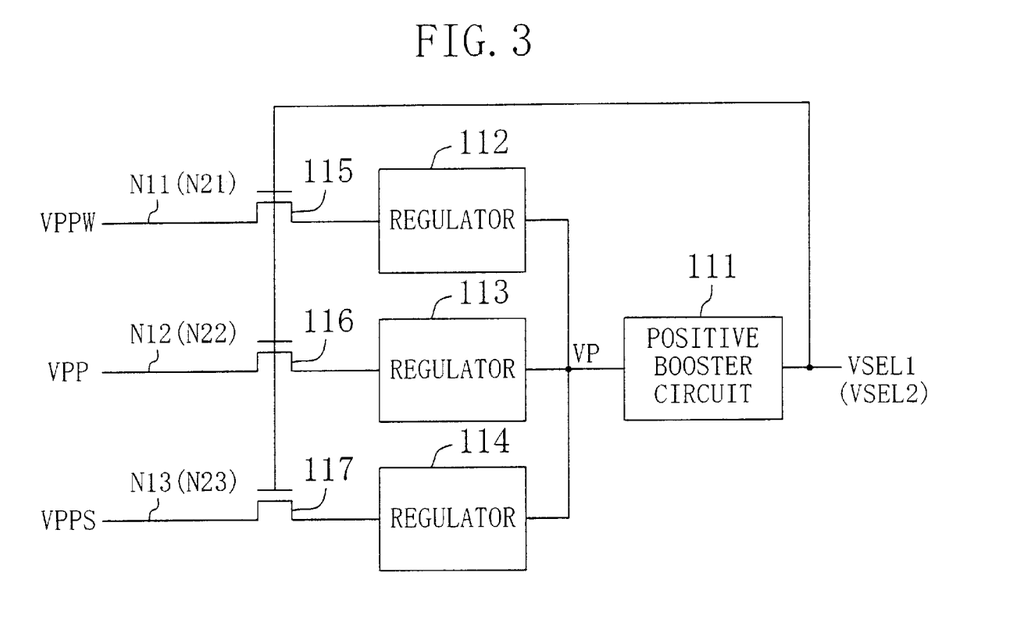
FIG. 3 is a block diagram showing the internal structure of a power supply circuit in FIG. 1.

FIG. 3 is a block diagram showing the internal structure of the power supply circuit 110 (120) in FIG. 1. As shown in FIG. 3, the power supply circuit 110 (120) includes a positive booster circuit 111, regulators 112 to 114, and N-channel MOS transistors 115 to 117. The positive booster circuit 111 operates in response to an H-level (logical high level) control signal VSEL1 (VSEL2), and outputs a boosted voltage VP obtained by boosting a power supply voltage VDD. The regulators 112 to 114 down-convert the boosted voltage VP from the positive booster circuit 111 to produce boosted voltages VPPW, VPP, VPPS, respectively. The N-channel MOS transistors 115 to 117 are connected between output nodes of the regulators 112 to 114 and the output nodes N11 to N13 (N21 to N23) of the power supply circuit 110 (120), respectively, and are turned ON/OFF in response to the control signal VSEL1 (VSEL2).

Figure 4:
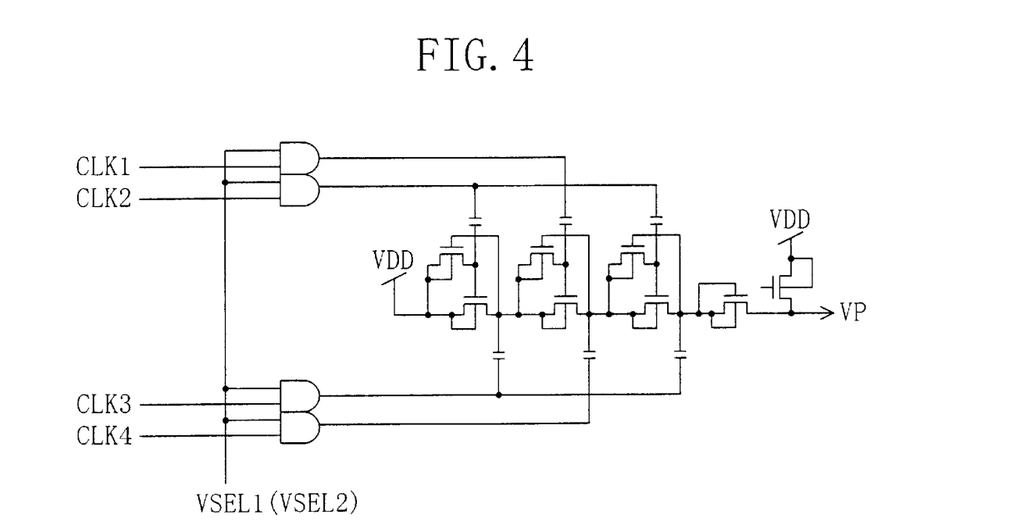
FIG. 4 is a circuit diagram showing the internal structure of a positive booster circuit in FIG. 3.

FIG. 4 is a circuit diagram showing the internal structure of the positive booster circuit 111 in FIG. 3. As shown in FIG. 4, the positive booster circuit 111 is a charge pump circuit for conducting pumping operation in response to four-phase clock signals CLK1 to CLK4 to produce a boosted voltage VP from the power supply voltage VDD. The positive booster circuit 111 operates when the control signal VSEL1 (VSEL2) is at H level, and is stopped when the control signal VSEL1 (VSEL2) is at L level (logical low level).

Hereinafter, operation of the non-volatile semiconductor memory device having the aforementioned structure will be described.

Figure 5:
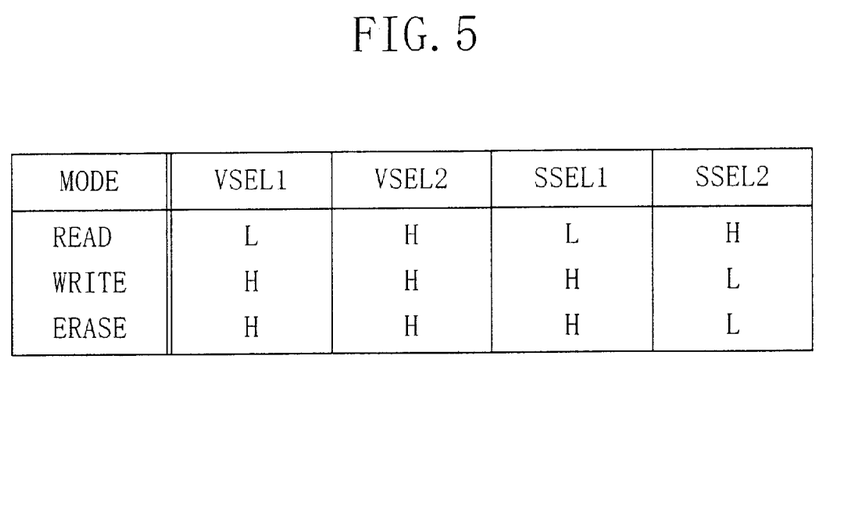
FIG. 5 shows the levels of control signals applied in write, erase and read operations.
Figure 6A:
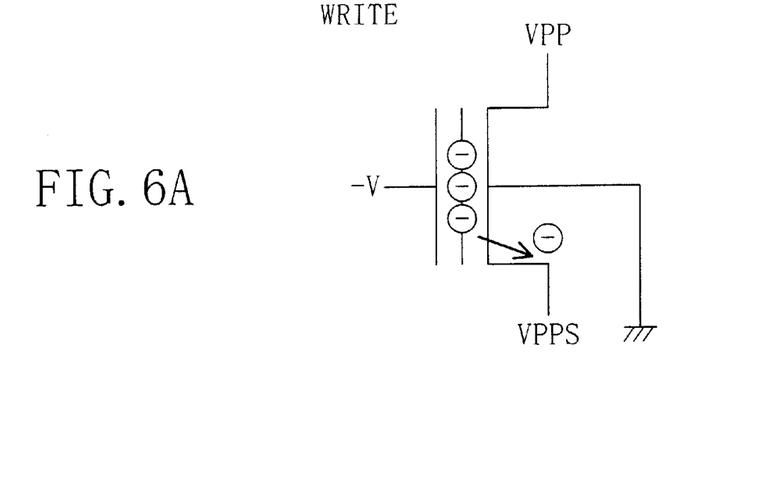
FIGS. 6A to 6C show voltages applied to a memory cell in write, erase and read operations, respectively.

First, write operation will be described. As shown in FIG. 5, in write operation, the control signals SSEL1, SSEL2 are rendered at H level and L level, respectively. As a result, the N-channel MOS transistors NT11 to NT13 in FIG. 1 are turned ON (connected state), and the N-channel MOS transistors NT31 to NT33 are turned OFF (open state). Since the output of the OR circuit 30 is at H level, the N-channel MOS transistors NT21 to NT23 are turned ON (connected state). Moreover, the control signals VSEL1, VSEL2 are rendered at H level, as shown in FIG. 5. As a result, the power supply circuits 110, 120 in FIG. 1 are activated, whereby the power supply circuit 110 supplies the boosted voltages VPPW, VPP, VPPS to the input nodes N14 to N16 of the memory bank 10, and the power supply circuit 120 supplies the boosted voltages VPPW, VPP, VPPS to the input nodes N24 to N26 of the memory bank 20, respectively. The row decoder 12 in each memory bank 10, 20 supplies a negative voltage −V to a word line corresponding to a memory cell to be written. The column decoder 14 and the column selection circuit 15 in each memory bank 10, 20 connect a bit line corresponding to the memory cell to be written to the I/O line PGIO. The write circuit 17 in each memory bank 10, 20 applies to the I/O line PGIO the boosted voltage VPP supplied from the corresponding power supply circuit 110, 120. Thus, the boosted voltage VPP is applied to the bit line corresponding to the memory cell to be written in each memory bank 10, 20. The source decoder 13 in each memory bank 10, 20 applies the boosted voltage VPPS supplied from the corresponding power supply circuit 110, 120 to a source line corresponding to a block including the memory cell to be written. A ground voltage is applied to the substrate of the memory cell to be written in each memory bank 10, 20. Thus, as shown in FIG. 6A, the negative voltage −V is applied to the control gate of the memory cell to be written in each memory bank 10, 20, the boosted voltage VPP is applied to the drain thereof, the boosted voltage VPPS is applied to the source thereof, and the ground voltage is applied to the substrate thereof, so that electrons are discharged from the floating gate. As a result, the memory cell thus written has a reduced threshold value. In this manner, write operation is simultaneously conducted in the memory banks 10, 20.

Figure 6B:
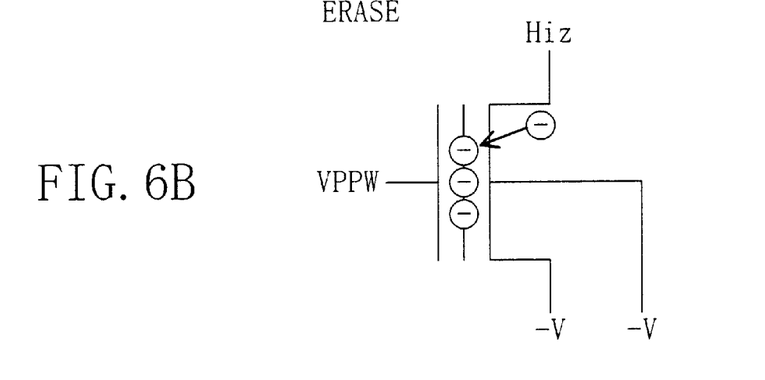

Hereinafter, erase operation will be described. As shown in FIG. 5, in erase operation, the control signals SSEL1, SSEL2 are rendered at H level and L level, respectively. As a result, the N-channel MOS transistors NT11 to NT13 in FIG. 1 are turned ON (connected state), the N-channel MOS transistors NT31 to NT33 are turned OFF (open state), and the N-channel MOS transistors NT21 to NT23 are turned ON (connected state). Moreover, the control signals VSEL1, VSEL2 are rendered at H level, as shown in FIG. 5. As a result, the power supply circuits 110, 120 in FIG. 1 are activated, whereby the power supply circuit 110 supplies the boosted voltages VPPW, VPP, VPPS to the input nodes N14 to N16 of the memory bank 10, and the power supply circuit 120 supplies the boosted voltages VPPW, VPP, VPPS to the input nodes N24 to N26 of the memory bank 20, respectively. The row decoder 12 in each memory bank 10, 20 applies the boosted voltage VPPW supplied from the corresponding power supply circuit 110, 120 to a word line corresponding to a memory cell to be erased. The column decoder 14 and the column selection circuit 15 in each memory bank 10, 20 render a bit line corresponding to the memory cell to be erased in a high impedance state (Hiz). The source decoder 13 in each memory bank 10, 20 supplies a negative voltage −V to a source line corresponding to a block including the memory cell to be erased. The negative voltage −V is also applied to the substrate of the memory cell to be erased in each memory bank 10, 20. Thus, as shown in FIG. 6B, the boosted voltage VPPW is applied to the control gate of the memory cell to be erased in each memory bank 10, 20, the drain thereof is rendered in the high impedance state (Hiz), and the negative voltage −V is applied to the source and the substrate thereof, so that electrons are injected into the floating gate. As a result, the memory cell thus erased has an increased threshold value. In this manner, erase operation is simultaneously conducted in the memory banks 10 and 20.

Figure 6C:
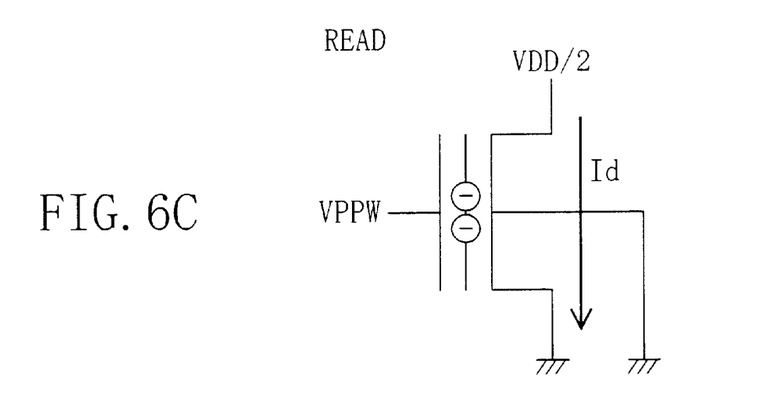
Figure 7:
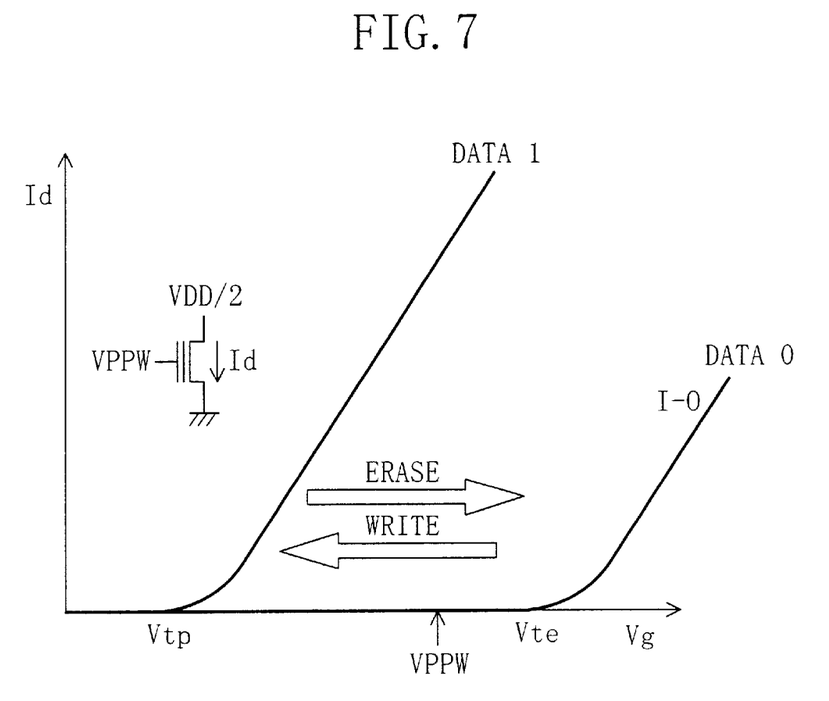
FIG. 7 shows the relation between a voltage applied to the control gate of a memory cell and a current flowing between the drain and the source thereof.

Hereinafter, read operation will be described. As shown in FIG. 5, in read operation, the control signals SSEL1, SSEL2 are rendered at L level and H level, respectively. As a result, the N-channel MOS transistors NT11 to NT13 in FIG. 1 are turned OFF (open state), and the N-channel MOS transistors NT31 to NT33 are turned ON (connected state). Since the output of the OR circuit 30 is at H level, the N-channel MOS transistors NT21 to NT23 are turned ON (connected state). Moreover, the control signals VSEL1, VSEL2 are rendered at L level and H level, respectively, as shown in FIG. 5. As a result, the power supply circuit 120 supplies the boosted voltages VPPW, VPP, VPPS to the input nodes N14 to N16 of the memory bank 10 through the N-channel MOS transistors NT31 to NT33, respectively. The power supply circuit 120 also supplies the boosted voltages VPPW, VPP, VPPS to the input nodes N24 to N26 of the memory bank 20 through the N-channel MOS transistors NT21 to NT23, respectively. At this time, the positive booster circuit 111 in the power supply circuit 110 is stopped in response to the L-level control signal VSEL1, and the N-channel MOS transistors 115 to 117 are turned OFF. Therefore, the output nodes N11 to N13 are rendered in a high impedance state. In read operation, either the memory bank 10 or 20 is accessed at a time, that is, two banks will not simultaneously be accessed. The row decoder 12 in the memory bank 10 or 20 supplies the boosted voltage VPPW from the power supply circuit 120 to a word line corresponding to a memory cell to be read. A voltage of ½VDD is supplied to a bit line corresponding to the memory cell to be read in the memory bank 10 or 20. The source decoder 13 in the memory bank 10 or 20 supplies the ground voltage to a source line corresponding to a block including the memory cell to be read. The ground voltage is also applied to the substrate of the memory cell to be read in the memory bank 10 or 20. The column decoder 14 and the column selection circuit 15 in the memory bank 10 or 20 connect the bit line corresponding to the memory cell MC to be read to the I/O line PGIO. As a result, as shown in FIG. 6C, the boosted voltage VPPW is applied to the control gate of the memory cell to be read in the memory bank 10 or 20, the voltage of ½VDD is applied to the drain thereof, and the ground voltage is applied to the source and the substrate thereof. In this case, if the memory cell to be read has data written therein, the threshold voltage vtp of the memory cell is lower than the boosted voltage VPPW applied to the control gate thereof, as shown in FIG. 7. Therefore, a current Id flows between the drain and the source. On the other hand, if the memory cell to be read has no data written therein, that is, the memory cell to be read is in the erased state, the threshold voltage Vte of the memory cell is higher than the boosted voltage VPPW applied to the control gate. Therefore, no current Id flows between the source and the drain. The read circuit 16 externally outputs the read data DQ indicating "1" when the current Id flows through the memory cell to be read, and "0" when no current Id flows therethrough.

As described above, in read operation, either the memory bank 10 or 20 is accessed at a time, that is, two banks will not simultaneously be accessed. However, the power supply circuit 120 always supplies the boosted voltages to both memory banks 10, 20, enabling high-speed read operation even when a memory bank to be accessed is changed.

According to the non-volatile semiconductor memory device of the present embodiment, in write operation, the memory banks 10, 20 are supplied with the boosted voltages from the corresponding power supply circuits 110, 120 through the N-channel MOS transistors NT11 to NT13, NT21 to NT23, respectively. On the other hand, in read operation, the memory banks 10, 20 are supplied with the boosted voltages from the power supply circuit 120 through the N-channel MOS transistors NT31 to NT33, NT21 to NT23, respectively. In either case, each output node of each power supply circuit is coupled to a corresponding input node of a corresponding memory bank through a single, corresponding N-channel MOS transistor. Accordingly, forming the N-channel MOS transistors NT11 to NT13, NT21 to NT23, NT31 to NT33 with the same size enables power supply source impedance seen by the memory bank 10 to be equal to that seen by the memory bank 20.

Note that the N-channel MOS transistors NT21 to NT23 are inserted in order to make the power supply source impedance seen by the memory bank 20 equal to that seen by the memory bank 10 in read operation. When it is not particularly necessary to make the power supply source impedances equal to each other, the N-channel MOS transistors NT11 to NT13, NT21 to NT23 may be omitted so that the power supply circuits 110, 120 are directly connected to the memory banks 10, 20.

Two N-channel MOS transistors (NT21, NT31), (NT22, NT32), (NT23, NT33) are present as load for each output node N21 to N23 of the power supply circuit 120. However, only one N-channel MOS transistor NT11 to NT13 is present as load for each output node N11 to N13 of the power supply circuit 110. Therefore, in the present embodiment, the capacitors C11 to C13 are connected to the output nodes N11 to N13 of the power supply circuit 110 in order to make the respective load capacitances of the power supply circuits 110, 120 equal to each other.

These considerations enable the boosted voltages to be accurately supplied to both memory banks 10, 20 on equal conditions by using exactly the same circuits as the power supply circuits 110, 120.

As has been described above, in the non-volatile semiconductor memory device according to the embodiment of the present invention, the boosted voltages generated by the power supply circuit 110 are supplied to the memory bank 10, and the boosted voltages generated by the power supply circuit 120 are supplied to the memory bank 120 in write and erase operations. Therefore, data can be written/erased to/from a multiplicity of memory cells in the memory banks 10, 20 while assuring sufficient current supply capability. In read operation, the boosted voltages from the power supply circuit 120 are supplied to the memory banks 10, 20, and the power supply circuit 110 is stopped, enabling suppression of power consumption.

Note that, although two memory banks and two power supply circuits are herein provided, the present invention is similarly applicable to the case where three or more memory banks and three of more power supply circuits are provided.

Moreover, although the N-channel MOS transistors NT11 to NT13, NT21 to NT23, NT31 to NT33 are herein used as first to third switches, P-channel MOS transistors may alternatively be used.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A non-volatile semiconductor memory device, comprising:

first and second memory banks;

a first power supply circuit for supplying to the first memory bank a boosted voltage for writing to a memory cell in the first memory bank in write operation; and a second power supply circuit for supplying to the second memory bank a boosted voltage for writing to a memory cell in the second memory bank in write operation, and for supplying to the first and second memory banks a boosted voltage for reading from a memory cell in the first and second memory banks in read operation.

2. A non-volatile semiconductor memory device for simultaneously writing to a plurality of memory banks in write operation, and selectively reading from at least one of the plurality of memory banks in read operation, comprising:

first and second memory banks;

a first power supply circuit for outputting a boosted voltage for writing to a memory cell in the first memory bank in write operation;

a second power supply circuit for outputting a boosted voltage for writing to a memory cell in the second memory bank in write operation, and for outputting a boosted voltage for reading from a memory cell in the first and second memory banks in read operation; and a supply control circuit for supplying the boosted voltage for writing from the first power supply circuit to the first memory bank as well as supplying the boosted voltage for writing from the second power supply circuit to the second memory bank in write operation, and for supplying the boosted voltage for reading from the second power supply circuit to the first and second memory banks in read operation.

3. The non-volatile semiconductor memory device according to claim 2, wherein the supply control circuit includes a first switch connected between the first memory bank and the first power supply circuit, a second switch connected between the second memory bank and the second power supply circuit, and a third switch connected between the first memory bank and the second power supply circuit, and the supply control circuit supplies the boosted voltage for writing from the first power supply circuit to the first memory bank through the first switch while supplying the boosted voltage for writing from the second power supply circuit to the second memory bank through the second switch in write operation, and supplies the boosted voltage for reading from the second power supply circuit to the first memory bank and the second memory bank through the third switch and the second switch in read operation, respectively.

4. The non-volatile semiconductor memory device according to claim 2, wherein the first power supply circuit is stopped in read operation.

5. The non-volatile semiconductor memory device according to claim 2, wherein the first power supply circuit renders its output in a high impedance state in read operation.

6. The non-volatile semiconductor memory device according to claim 3, wherein an ON resistance value of the second switch is equal to that of the third switch.

7. The non-volatile semiconductor memory device according to claim 2, wherein the first and second memory banks include FN (Fowler-Nordheim) erase/FN write type electrically rewritable non-volatile memory cells.

8. The non-volatile semiconductor memory device according to claim 2, wherein each of the first power supply circuit and the second power supply circuit includes a booster circuit having a charge pump.

9. The non-volatile semiconductor memory device according to claim 2, further comprising a capacitor connected to an output node of the first power supply circuit.

10. The non-volatile semiconductor memory device according to claim 2, wherein the first power supply circuit outputs a boosted voltage for erasing to a memory cell in the first memory bank in an erase operation, the second power supply circuit outputs a boosted voltage for erasing to a memory cell in the second memory bank in the erase operation, and the supply control circuit supplies the boosted voltage for erasing from the first power supply circuit to the first memory bank as well as supplying the boosted voltage for erasing from the second power supply circuit to the second memory bank in the erase operation.

* * * * *